United States Patent
Sovik

(10) Patent No.: US 7,898,442 B1
(45) Date of Patent: Mar. 1, 2011

(54) ON-LINE DATA COMPRESSION ANALYSIS AND REGULATION

(75) Inventor: Mark Anthony Sovik, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/866,607

(22) Filed: May 30, 1997

(51) Int. Cl.
*H03M 7/00* (2006.01)
(52) U.S. Cl. ......................................................... 341/51
(58) Field of Classification Search .................... 341/50, 341/51, 67, 106
See application file for complete search history.

(56) References Cited

U.S. PATENT DOCUMENTS

| | | | | |
|---|---|---|---|---|
| 4,847,619 A | * | 7/1989 | Kato et al. ................... | 341/106 |
| 4,881,075 A | * | 11/1989 | Weng ........................... | 341/87 |
| 5,175,543 A | * | 12/1992 | Lantz ........................... | 341/51 |
| 5,243,341 A | * | 9/1993 | Seroussi et al. ................ | 341/51 |
| 5,253,325 A | | 10/1993 | Clark ............................ | 395/2 |
| 5,298,895 A | * | 3/1994 | Van Maren ................... | 341/51 |
| 5,323,155 A | * | 6/1994 | Iyer et al. ..................... | 341/51 |
| 5,486,826 A | * | 1/1996 | Remillard ..................... | 341/51 |
| 5,561,421 A | | 10/1996 | Smith et al. .................. | 341/51 |
| 5,627,533 A | * | 5/1997 | Clark .......................... | 341/51 |
| 5,686,912 A | * | 11/1997 | Clark, II et al. ............... | 341/51 |

\* cited by examiner

*Primary Examiner*—Brian Young
(74) *Attorney, Agent, or Firm*—Gray Cary Ware Freidenrich

(57) ABSTRACT

Data compression efficacy in a data storage system is analyzed, and data compression modified in accordance with the results of such analysis, thereby saving otherwise wasted processor time when data compression is poor. Multiple input data blocks are received for storage in a data storage subsystem, and a predetermined compression process is applied thereto. Application of the predetermined compression process is evaluated according to a predetermined compression criteria. If the compression fails to satisfy the predetermined compression criteria, application of the predetermined compression process ceases.

27 Claims, 6 Drawing Sheets

ON-LINE DATA COMPRESSION ANALYSIS AND REGULATION

BACKGROUND OF THE INVENTION

1. Field of the Invention

The present invention relates to data compression in data storage systems. More particularly, the invention concerns a method, apparatus, and article of manufacture for analyzing data compression efficacy and modifying data compression in accordance with the results of such analysis, where the analysis and regulation is done on-line.

2. Description of the Related Art

Many data storage systems achieve improved storage efficiency by employing data compression. Rather than simply storing data exactly as received from a user, data can be stored in a compressed format. Often, this compression is achieved by substituting shorter codes for lengthier data that frequently occur in the database. As a simple example, each occurrence of the address "1000 Maple Street" in a database may instead be represented in the database by "*". The stored database is therefore considerably shorter, since each occurrence of "1000 Maple Street" is reduced to "*". Translations between expanded data and compressed codes are stored in a compression/decompression dictionary, known to those in the art simply as a "dictionary".

In many known applications, data compression techniques are successfully applied to databases and their log records, significantly increasing the data storage efficiency of these applications. In some cases, however, implementation of known data compression techniques fail to provide the theoretically envisioned level of data storage efficiency.

This can occur for a number of reasons. For example, the dictionary may be created based upon a subset of interrogated data, which turns out to be a poor representative of the database as a whole. Or, in the case of a "static" dictionary, the dictionary may be accurate when created, but the nature of the data changes, causing the dictionary to become stale. This phenomenon frequently occurs with time-dependent data. The static dictionary may be created, for example, in February, when much of the underlying data includes the word "February". When March arrives, most of the underlying data include the word "March" rather than "February"; since the original static dictionary does not contain "March", its compression activities are poorly guided with respect to the current data sought to be compressed.

As a result of the foregoing conditions, certain data cannot be compressed because the data is missing from the dictionary. Yet, compression is still attempted for this data, albeit unsuccessfully. And these frustrated "compression calls" still require time to perform, occupying valuable processor time, which could otherwise be spent performing other tasks.

One option is to simply deactivate compression. Although this approach saves processor time otherwise spent on frustrated compression attempts, the input/output efficiency suffers because data is now stored in its full-length, uncompressed form. Another option is to rebuild the dictionary anew, in accordance with the current data. Rebuilding the dictionary, however, typically requires taking the data storage subsystem off-line. This is simply not an option for certain applications, where continuous data availability is crucial, such as automated teller machines, internationally accessible financial data, twenty-four hour telephone directory services, etc.

Consequently, known compression schemes are not completely adequate for some applications due to certain unsolved problems.

SUMMARY OF THE INVENTION

Broadly, the present invention concerns the on-line analysis of data compression efficacy in a data storage system, where data compression is modified in accordance with the results of such analysis. In one embodiment, multiple input data blocks are received for storage in a data storage subsystem. A predetermined compression process is applied to the data blocks. Application of the predetermined compression process is evaluated according to a predetermined compression criteria.

As examples, this evaluation may be conducted using a fixed window, running window, and it may evaluate individual data blocks or an aggregate compression. If the compression fails to satisfy the predetermined compression criteria, application of the predetermined compression process ceases.

In one embodiment, the invention may be implemented to provide a method to evaluate data compression and regulate data compression in response to the evaluation. In another embodiment, the invention may be implemented to provide an apparatus such as a data storage subsystem, to evaluate data compression and regulate data compression in response to the evaluation. In still another embodiment, the invention may be implemented to provide signal-bearing media tangibly embodying a program of machine-readable instructions executable by a digital data processing apparatus to perform method steps to evaluate data compression and regulate data compression in response to the evaluation.

The invention affords its users with a number of distinct advantages. Chiefly, the invention conserves valuable processor time by avoiding compression when an evaluation of past data blocks' compression indicates that compression fails to meet a user-selected criteria. The invention also provides a number of other advantages and benefits, which should be apparent from the following description of the invention.

BRIEF DESCRIPTION OF THE DRAWINGS

The nature, objects, and advantages of the invention will become more apparent to those skilled in the art after considering the following detailed description in connection with the accompanying drawings, in which like reference numerals designate like parts throughout, wherein.

DETAILED DESCRIPTION OF THE PREFERRED EMBODIMENTS

Hardware Components & Interconnections

Figure 1:
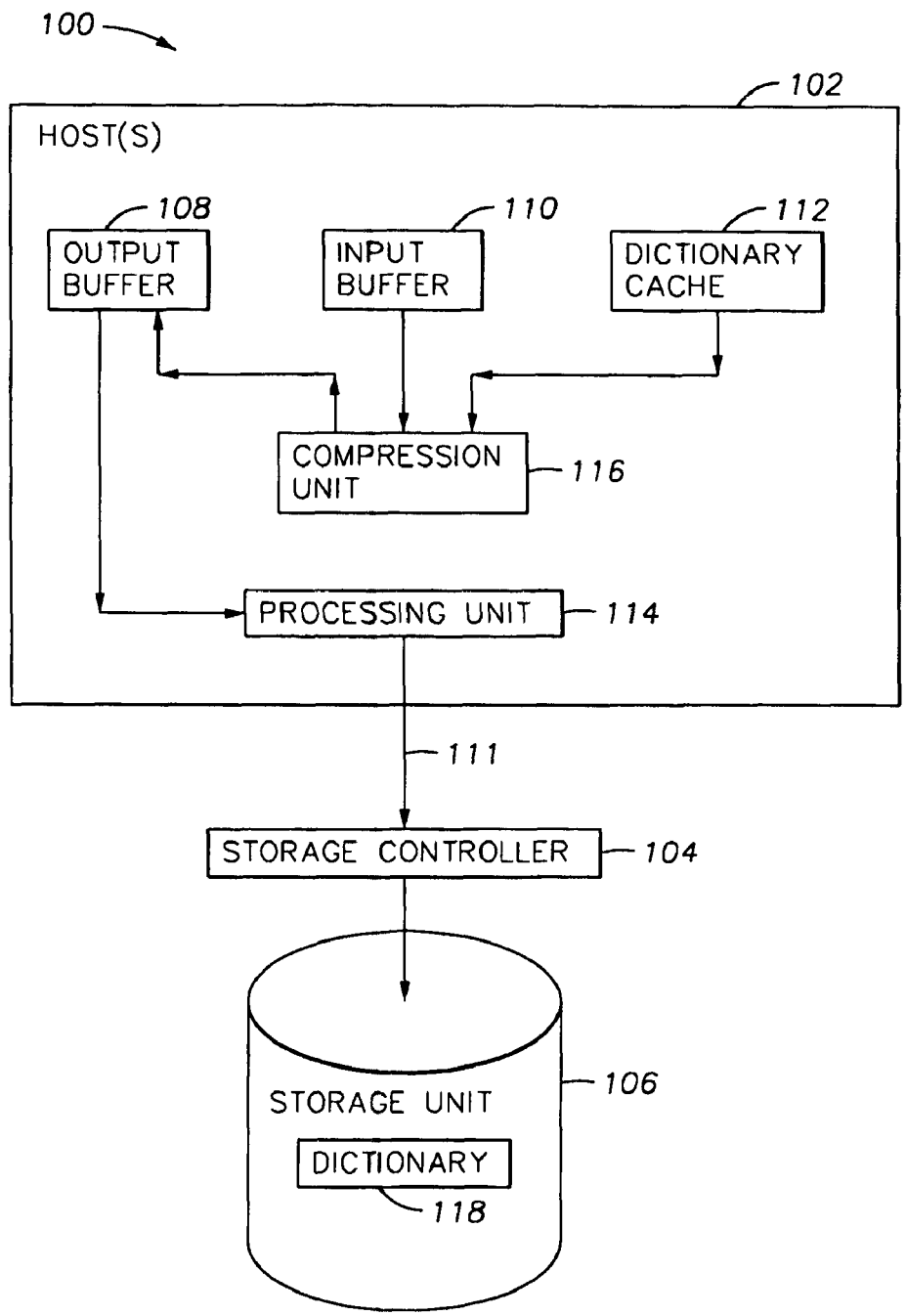
FIG. 1 is a block diagram of the hardware components and interconnections of a data storage subsystem in accordance with the invention.

One aspect of the invention concerns a data storage subsystem that stores data with data compression, analyzes the compression to provide feedback, and regulates compression according to the feedback. The data storage subsystem of the invention may be embodied by various hardware components and interconnections. To show an example, FIG. 1 depicts a data storage subsystem 100. The subsystem 100 includes a host 102, storage controller 104, and storage unit 106.

Storage Unit

Preferably, the storage unit 106 comprises a cost efficient data storage unit suitable for a data storage subsystem. In this respect, the storage unit 106 may comprise a direct access storage device (DASD) such as one or more magnetic hard disk drive assemblies. In addition, or as an alternative, other storage means may be employed, such as magnetic tape storage, optical tape, optical disks, integrated circuit memory, or any other data storage type.

Since the storage unit 106 is cost efficient, this is a preferable location for a data dictionary 118, rather than storing the dictionary 118 elsewhere in more expensive storage, such as random access memory. However, cache 112 is preferably used to store as much of the dictionary as space permits, to minimize dictionary access time. The data dictionary 118 comprises a static data dictionary, which may be formed using a novel technique or by one or many techniques familiar to ordinarily skilled artisans.

Controller

The storage controller 104 provides an interface between the host 102 and the storage unit 106. The controller 104 may comprise a new component satisfying this purpose, or an existing product depending upon the needs of the application.

Host: Generally

The host 102 comprises a computer performing an application program requiring storage and retrieval of data on the storage unit 106. The host 102 may comprise any digital data processing machine, specific examples of which include mainframe computers, personal computers, workstations, etc.

The host 102 is connected to the controller 104 via an input/output line 111, which may comprise one or more wires, cables, fiber optic links, electromagnetic links, intelligent channels, or any other suitable means for conveying data and commands between the host 102 and controller 104. The host 102 includes a number of components, which may be constructed using suitable hardware or software implementations, as shown below. These components include a compression unit 116, an output buffer 108, an input buffer 110, a dictionary cache 112, and a processing unit 114.

Host Buffers

The input buffer 110 is coupled to the compression unit 116. The input buffer 110 receives data blocks provided by the host 102 for storage in the unit 106, and makes the input data blocks available to the compression unit 116. Although the input buffer 110 may be implemented by suitable memory hardware such as random access memory, it may also comprise an appropriate software construct.

The output buffer 108 is coupled to the compression unit 116 and the processing unit 114. Input data blocks from the input buffer 110 that are compressed are stored by the compression unit 116 in the output buffer 108. In some cases, as explained below, data blocks are routed to the output buffer 108 without any compression. Although the input buffer 110 may be implemented by suitable memory hardware such as random access memory, it may also comprise an appropriate software construct.

Host: Dictionary Cache

The dictionary cache 112 is coupled to the compression unit 116. The dictionary cache 112 contains a cached portion of the static dictionary 118, enabling the compression unit 116 to more quickly compress data from the input buffer 110 according to the established dictionary. The dictionary cache 112 may be implemented by suitable memory hardware such as random access memory, or an appropriate software construct if desired. To speed operation of the compression unit 116, the dictionary cache 112 is preferably as large as expenses permit, and can contain the entire dictionary if desired.

Host Processing Unit

The processing unit 114 manages transfers of compressed data from the output buffer 108 to the storage controller 104 and eventually to the storage unit 106. The processing unit 114 may also manage retrieval of data from the storage unit 106 via the storage controller 104. The processing unit 114 may comprise one or more microprocessors, a personal or mainframe computer, custom integrated circuit, discrete circuitry, or any other electronic or software module to manage exchanges of data between the storage unit 106 and the output buffer 108. This may also include, for example, other tasks such as addressing and formatting of data.

Host: Compression Unit

The compression unit 116 applies the compression scheme of the dictionary 118 to input data received into the input buffer 110, sending the compressed data to the output buffer 108. As mentioned above, transfers of compressed data from the output buffer 108 to the storage unit 106 are conducted by the processing, unit 114. In accordance with the invention, the compression unit 116 also evaluates the success of its compression, and regulates future compression in accordance with these evaluations. These tasks are discussed in much greater detail below.

The compression unit 116 may be implemented in various ways, depending upon the specific needs of the application. In one embodiment, the compression unit 116 may be implemented by an electronic module including, discrete circuitry, programmable circuit components, logic circuitry, or a combination. Preferably, the compression unit 116 is embodied by suitable application-specific integrated circuitry. As another alternative, some of the features of this module may be implemented in software, while others are implemented using suitable hardware.

Figure 2:
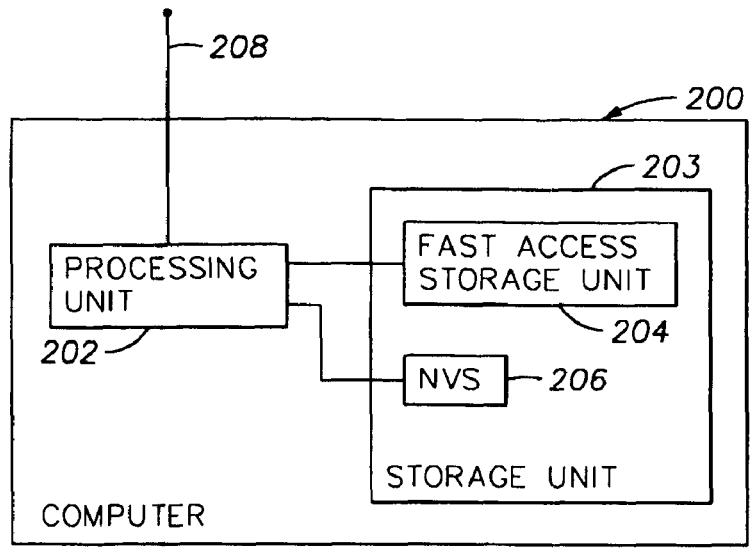
FIG. 2 is a block diagram of a compression unit implemented by a computer in accordance with the invention.

In another embodiment, the compression unit is implemented completely in software, by using a digital computer to execute a sequence of programming, instructions. In this embodiment, then, the components of the formatting unit comprise software modules or functional units, rather than actual hardware components. This embodiment is therefore implemented using a digital computer 200, as shown in FIG. 2.

The computer 200 includes a processing unit 202, such as a microprocessor or other processing machine, coupled to an input/output line 208. The processing unit 202 is also coupled to a storage unit 203, an example of which includes a fast-access storage unit 204 and a nonvolatile storage (NVS) unit 206. The fast-access storage unit 204 preferably comprises random access memory, and may be used to store the programming instructions executed by the processing unit 202. The nonvolatile storage unit 206 may comprise, for example, one or more magnetic data storage disks such as one or more "hard drives", tape drives, or other suitable storage devices. The computer 200 also includes an input/output 208, such as a line or bus for exchanging data with the processing unit 202.

Despite the specific foregoing description, ordinarily skilled artisans (having the benefit of this disclosure) will recognize that the computer 200 may be still implemented in a computer of different construction, without departing from the scope of the invention. As a specific example, one of the storage units 204/206 may be eliminated. Furthermore the processing unit 202 may be provided with on-board storage instead of the units 204/206. Furthermore, some or all of the components 202/204/206 may be shared or subsumed by other hardware devices, such as processing equipment of the host 102.

Operation

In addition to the various hardware embodiments described above, a different aspect of the invention concerns a method for conducting data compression. According to the method of the invention, data compression is evaluated according to a predetermined criteria and subsequently regulated in accordance with such evaluation.

Signal-Bearing Media

Such a method may be implemented, for example, by operating the compression unit 116 to execute a sequence of machine-readable instructions. These instructions may reside in various types of signal-bearing media. In this respect, one aspect of the present invention concerns a programmed product, comprising signal-bearing media tangibly embodying a program of machine-readable instructions executable by a digital data processor to perform data compression.

Figure 3:
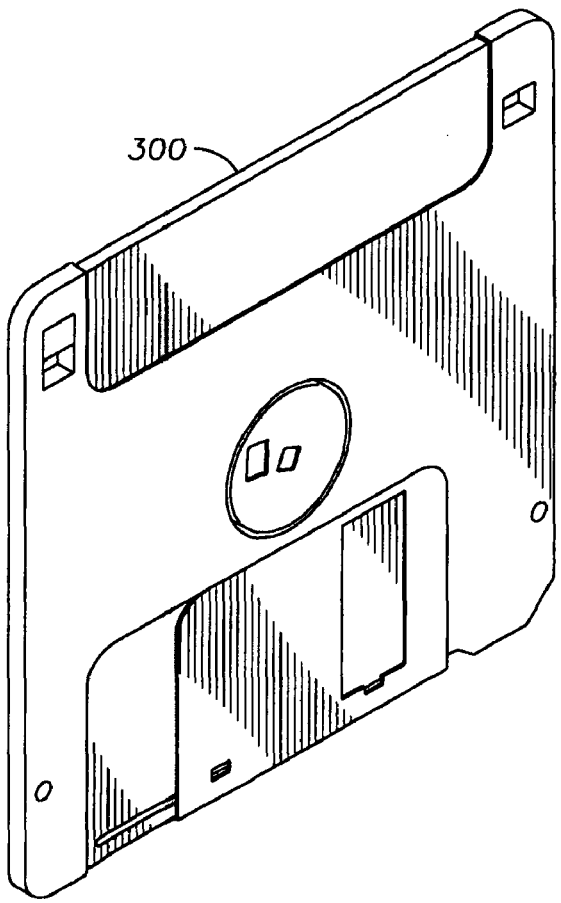
FIG. 3 is a perspective view of an exemplary signal-bearing medium embodying a data storage medium in accordance with the invention.

This signal-bearing media may comprise, for example, RAM (not shown) contained within or otherwise accessible to the compression unit 116. Alternatively, the instructions may be contained in another signal-bearing media, such as a magnetic data storage diskette 300 (FIG. 3), directly or indirectly accessible by the compression unit 116. Whether contained in the host 102 or elsewhere, the instructions may stored on a variety of machine-readable data storage media, such as DASD storage (e.g., a conventional "hard drive" or a RAID array), magnetic tape, electronic read-only memory (e.g. CD-ROM or WORM), an optical storage device (e.g. WORM), paper "punch" cards, or other suitable signal-bearing media including transmission media such as digital and analog and communication links and wireless. In an illustrative embodiment of the invention, the machine-readable instructions may comprise lines of compiled PLX or PLAS language code.

General Sequence of Operation

Figure 4:
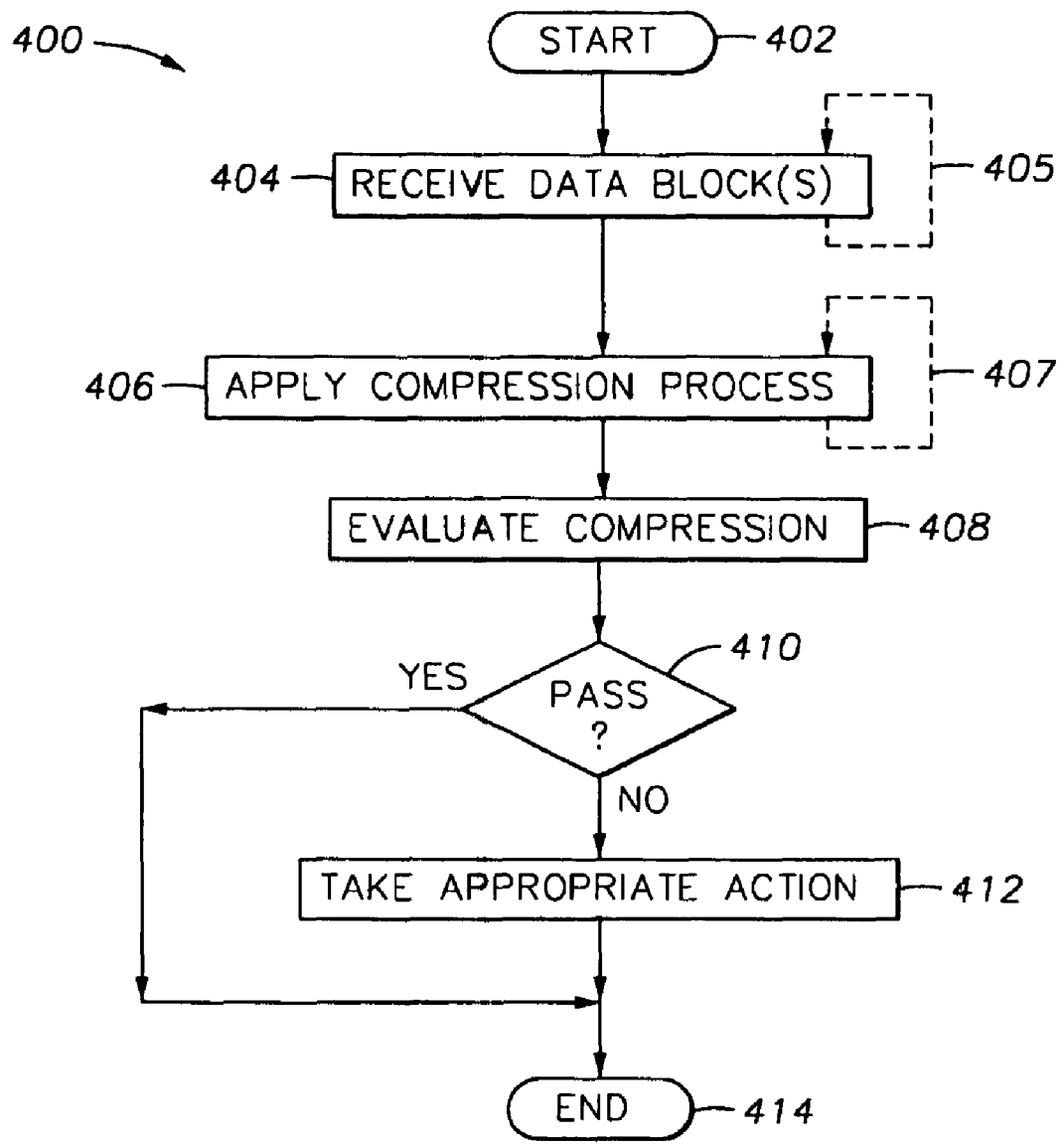
FIG. 4 is a basic flowchart illustrating data compression according to the invention.

FIG. 4 depicts an sequence 400 for data compression in accordance with the invention. As explained more fully below, all of the steps 400 may be performed by the subsystem 100, or some may be shared with a human operator (not shown). For ease of explanation, but without any limitation intended thereby, the example of FIG. 4 is described in the context of the data storage subsystem 100 described above. As an example, the routine 400 may be initiated or "called" in step 402 by a hierarchically superior process, referred to as the "calling process". After the routine 400 begins in step 402, the input buffer 110 receives a number of input data blocks. A data "block" preferably comprises a contiguous group of related data, such as one record, multiple records, or another convenient unit of data. As shown by the routing 405, step 404 may be performed repeatedly during the performance of subsequent steps beginning with step 406. The data blocks are preferably received in certain particular order, this order being preserved in the input buffer 110.

In step 406, the compression unit 116 applies a predetermined compression process to the next data block in the input buffer 110. The compression process may comprise a novel compression process, or another process familiar to ordinarily skilled artisans. One example is the LZ2 technique, disclosed in U.S. Pat. No. 5,561,421, and assigned to International Business Machines Corporation. As shown by the routing 407, step 406 may repeat during the performance of subsequent steps beginning with step 408. The compression unit 116 stores each compressed data block in the output buffer 108, for subsequent transfer to the storage unit 106.

In step 408, the compression unit 116 evaluates compression. As explained more thoroughly below, this may be performed by evaluating the individual compression ratios of data blocks from a fixed or running window, or by evaluating the aggregate compression ratio for data blocks in a fixed or running window. After step 408, the compression unit 116 in step 410 determines whether the evaluated compression passes a predetermined criteria. If the evaluated compression passes, control is transferred to step 414, returning compressed data in the output buffer 108 to the calling process for storage in the unit 106.

On the other hand, if the evaluated compression fails, appropriate action is taken in step 412. As an example, the compression unit 116 and/or processing unit 114 may automatically disable compression, thus storing data in the storage unit 106 in uncompressed form. Disabled compression may continue indefinitely, or it may end after predetermined time or after storage of a number of uncompressed data blocks.

Alternatively, or in addition, step 412 may involve appropriate steps taken by a human operator to deal with the failed compression. For example, the human operator may simply disable compression indefinitely, adjust the parameters of compression evaluation, or initiate formation of a new dictionary. After step 412, the routine ends in step 414.

More Specific Examples

Figure 5A:
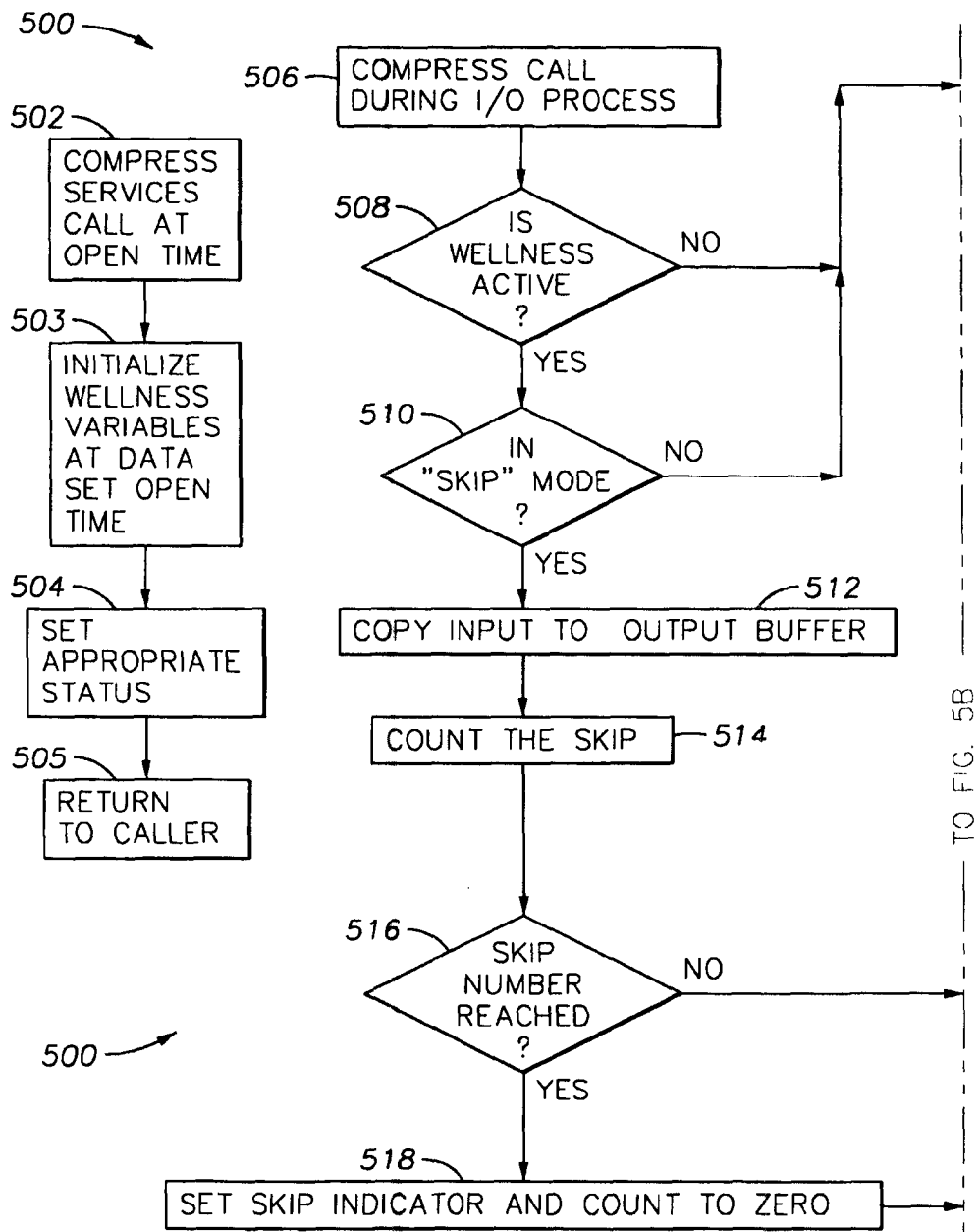
FIGS. 5A-5B are a detailed flowchart illustrating a specific example of data compression according to the invention.
Figure 5B:
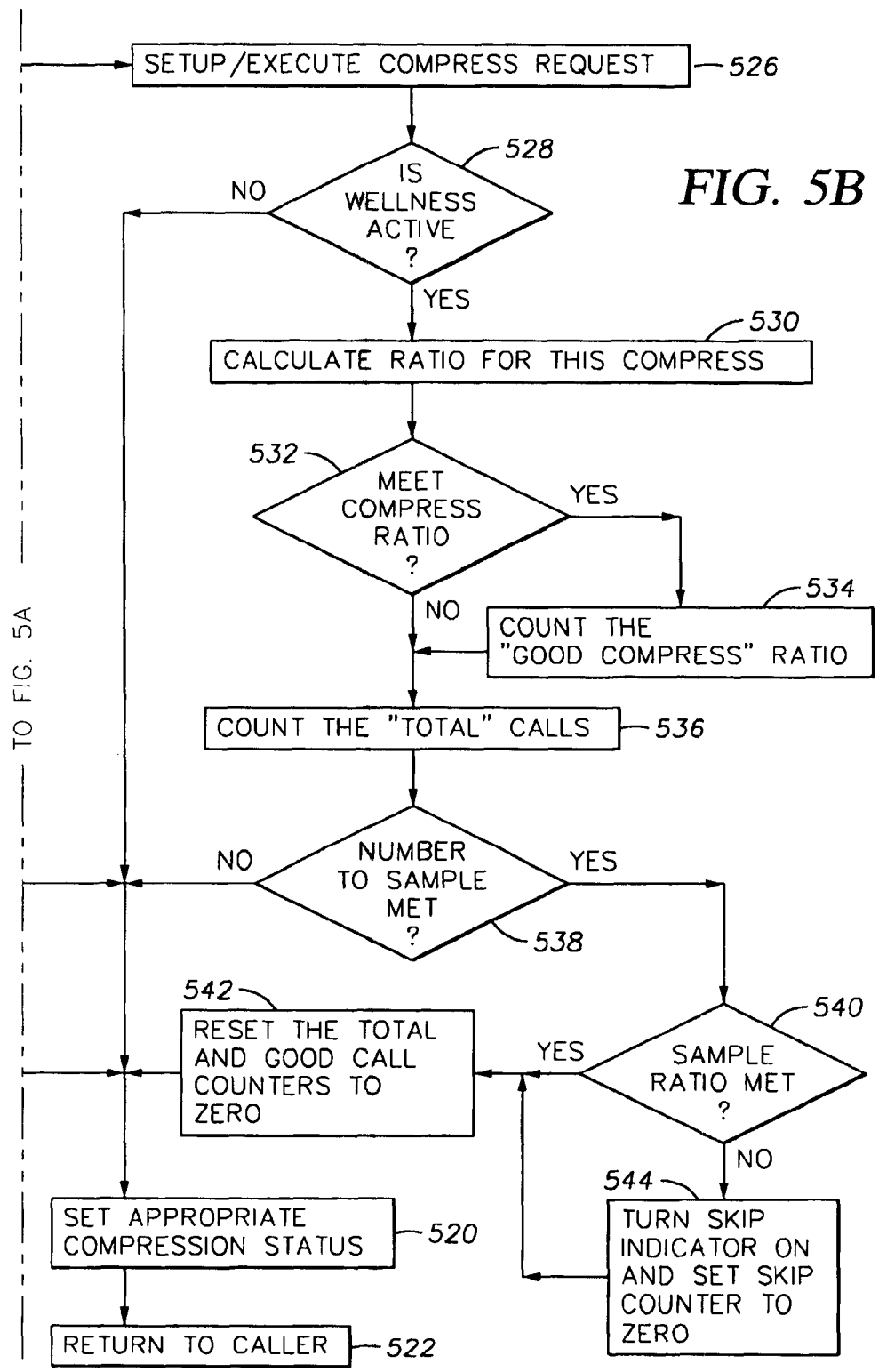
Figure 6:
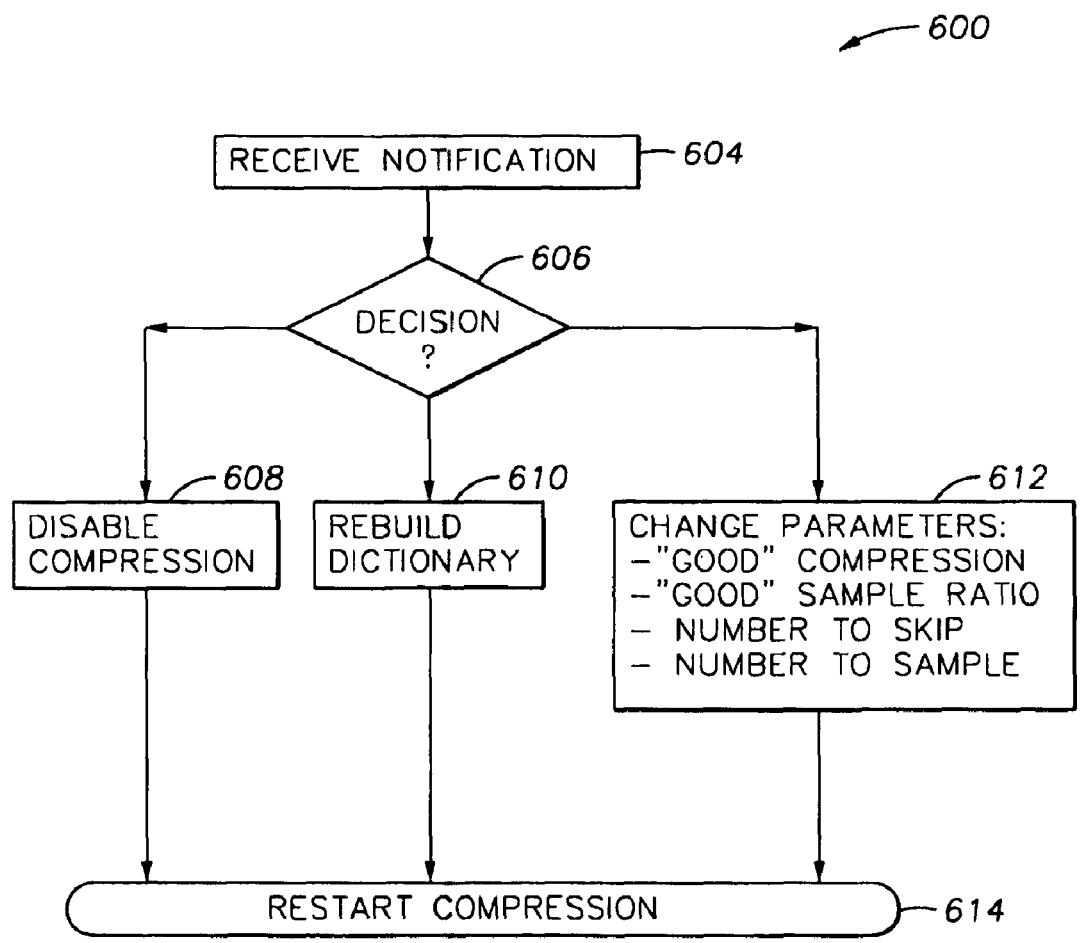
FIG. 6 is a flowchart illustrating an example of operational steps performed after detecting poor compression efficacy.

FIGS. 5A, 5B and 6 provide more specific example of one implementation of the routine 400. For ease of explanation, but without any limitation intended thereby, the examples of FIGS. 5A, 5B and 6 are is described in the context of the data storage subsystem 100 described above. FIGS. 5A-5B depict a machine-executed sequence 500, performed by the storage unit 104, as one implementation of the routine 400 (FIG. 4). FIG. 6 shows a sequence 600 performed by a human operator, as an example of how step 412 may be implemented.

Machine-Executed Steps: Compression & Evaluation (FIGS. 5A-5B)

Adjustable Parameters

The routine 500 (FIGS. 5A-5B) operates according to a number of adjustable parameters. These parameters determine how compression is evaluated and regulated. Preferably, these parameters are selected by a human operator, and downloaded to the compression unit 116 for use thereby. In this respect, the parameters are programmable, and may even be hanged during operation of the sequence 500. In the illustrated embodiment, the invention utilizes adjustable parameters as shown in Table 1, below. The functions of these parameters are explained in conjunction with the sequence 500 below.

TABLE 1

Adjustable Parameters

| Parameter | Function |
|---|---|
| GOOD COMPRESS RATIO | what % of compression is deemed "good" for an individual compress call? |
| NUMBER TO SAMPLE | how many compress calls are to be sampled for evaluation? |
| GOOD SAMPLE RATIO | what ratio of "good" to "bad" compress calls, |

TABLE 1-continued

Adjustable Parameters

| Parameter | Function |
| --- | --- |
| NUMBER TO SKIP | sampled for evaluation, are acceptable? in response to unacceptable compression, how many compress calls are to be skipped before performing compression again? |

Alternatively, if desired, the adjustable parameters may be fixed, without requiring any use selection of the parameters.

Counters/Indicators

The routine 500 also utilizes a number of counters and indicators. Unlike the adjustable parameters, the counters and indicators are not user-defined. The counters and indicators assist the compression unit 116 by recording various statistics, which help to evaluate compression. In the illustrated embodiment, the invention utilizes counters/indicators as shown in Table 2, below. The individual functions of these counters/indicators are explained in conjunction with the sequence 500 below.

TABLE 2

Counters/Indicators

| Counter | Function |
| --- | --- |
| WELLNESS ACTIVE | is compression evaluation enabled? |
| SKIP ACTIVE | in response to unacceptable compression, has the "skip mode" been activated? |
| GOOD COMPRESS CALLS | how many compress calls have been "good"? |
| NUMBER SAMPLED | how many compress calls have been sampled/evaluated? |
| NUMBER SKIPPED | since entering the skip mode, how many compress calls have been skipped? |

Sequence 500: Step-by-Step Description

Steps 502-505 are initiated whenever the host 102 "opens" a group of multiple data blocks, called a data set. As known in the art, opening of a data set is a precursor to accessing the data set, and involves building control structures, locating the data, and otherwise initializing use of the data. In step 502, opening of a data set results in a "call" or invocation of steps 502-505, which prepare for compression according to the invention. Step 503 initialized the counters/indicators also called "wellness variables". Then step 504 returns a message indicating the status of the opening of the data, reporting on the success or failure of the data opening by returning various codes, which may be known to those in the art.

Subsequent to a data set's opening according to step 502-505, the host 102 initiates an input/output operation involving the data set. If the input/output operation involves storage of data in the storage unit 106, a request for compression (a "compress call") is inherently involved. Namely, the input/output operation constitutes a "calling process", invoking data compression according to the invention. More particularly, task 506 is performed when an individual data block (from an opened data set) is selected from the input buffer 110 for storage in the unit 106, thereby effecting a "compress call" for that data block.

After "compress call" 506, step 508 determines whether the compression evaluation and regulation of the invention (also called compression "wellness") is active. As discussed below, wellness may be deactivated under certain conditions. If wellness is active, control proceeds to step 510 to determine whether a previous compression evaluation has initiated a "skip mode", in which compression is temporarily disabled. This is determined by asking whether the SKIP ACTIVE indicator has been set to a predetermined value such as binary "one". If so, compression in accordance with the present "compress call" will be skipped. In particular, the compression unit 116 in step 512 copies the data block from the input buffer 110 directly to the output buffer 108 without any compression. Then, step 514 increments the NUMBER SKIPPED counter, which represents the number of compress calls skipped in the skip mode. Step 516 then asks whether the NUMBER SKIPPED counter has reached a threshold established by the NUMBER TO SKIP parameter. The NUMBER TO SKIP parameter, preset by a user, is an adjustable parameter the determines how long the skip mode lasts. If the NUMBER SKIPPED counter has reached the NUMBER TO SKIP parameter, the prescribed number of compression calls have been skipped; accordingly, step 518 resets the NUMBER SKIPPED counter to zero, and also resets the SKIP ACTIVE indicator to zero. After step 518 (or a negative answer to step 516), control passes to step 520. Step 520 notifies calling process of the operation results, so that the calling process can take appropriate action as described below. Then, after step 520, the routine 500 ends in step 522.

In contrast to the preceding steps, if step 510 finds that the skip mode is not active (or if wellness is not active), step 526 proceeds with setting up and executing the compression request. In particular, the compression unit 116 in step 526 retrieves the next queued data block from the input buffer 110, compresses the data block, and stores the compressed data block in the output buffer 108. After step 526, step 528 then asks again whether wellness is active; if not, control passes to steps 520 and 522, where the routine 500 completes. In this case, step 522 signals the calling process to proceed with storage of the compressed data block from the output buffer 108 into the storage unit 106.

If, however, step 528 finds that wellness is active, the routine 500 begins to evaluate the compression performed in step 526. First, in step 530, the compression unit 116 calculates the compression ratio for the compress call satisfied in step 526. As an example, the compression ratio may be calculated according to Equation 1, below.

compression ratio=data size after compression÷data size before compression

After step 530, the compression unit 116 in step 532 determines whether the compression ratio meets the threshold established by the GOOD COMPRESS RATIO. If so, step 534 increments the GOOD COMPRESS CALLS counter and the step 536 increments NUMBER SAMPLED counter. If the compression ratio falls short of the GOOD COMPRESS RATIO, step 536 merely increments the NUMBER SAMPLED counter.

After step 536, step 538 asks whether the number of samples prescribed by the NUMBER TO SAMPLE parameter has been met. This is determined by asking whether the NUMBER SAMPLED counter has reached the NUMBER TO SAMPLE parameter. If not, the routine 500 ends after completing steps 520 and 522.

When the NUMBER SAMPLED counter reaches NUMBER TO SAMPLE parameter, however, an entire sample set of compress calls is ready to be evaluated. In this case, step 540 asks whether the desired ratio of good samples to bad samples has been met. In particular, the desired ratio has been met if Equation 2 (below) is satisfied.

GOOD COMPRESS CALLS÷NUMBER SAMPLED>GOOD SAMPLE RATIO    [2]

If the desired ratio has been met, step 542 sets the NUMBER SAMPLED and GOOD COMPRESS CALLS counters to zero. Otherwise, if the desired ratio has not been met, step 544 sets the SKIP ACTIVE indicator to a prescribed value, such as binary "one" to indicate that the skip mode is activated. Step 544 also sets the NUMBER SKIPPED counter to zero. After steps 542 or step 544, the routine 500 completes after performing steps 520 and 522.

Sequence 500: Exemplary Adjustable Parameters

As one example, the routine 500 may be performed using the following adjustable parameters:
1. GOOD COMPRESS RATIO=90%.
2. NUMBER TO SAMPLE=16
3. GOOD SAMPLE RATIO=0.75
4. NUMBER TO SKIP=68

Sequence 500: Alternative Evaluation Strategies

As illustrated, the sequence 500 evaluates compression of (1) individual data blocks (2) using a "fixed window". Namely, (1) compression is evaluated for each individual data block, using the GOOD COMPRESS CALLS to keep track and (2) there is a fixed window because samples are collected for a predetermined number of compress calls, and then compression is evaluated for that group of samples.

Various alternative strategies may be used instead, without departing from the scope of the invention. For example, while still using the fixed window, an aggregate compression evaluation may be used instead of evaluating the compression of data blocks individually. With this technique, no single compression call is "good" or "bad". Instead of evaluating the compression of each data block individually, this technique computes a compression ratio by comparing the aggregate size of a sample group of data blocks after compression to their aggregate size before compression.

Another strategy uses a "running window" to evaluate individual data block compression, combining the previously explained approaches. With this technique, each data block's compression is evaluated as performed by the routine 500. However, instead of counting sampling of a predetermined number of compress calls, then determining compression on this fixed window of samples, a "running window" is used. Namely, compression is evaluated after each compress call, by examining the ratio of good/bad compressions in a preceding group of N sample compress calls. After each compress call, the preceding group of N sample compress calls changes, thereby providing a "running window".

Still another approach is to utilize aggregate compression evaluation as discussed above, but with a running window. Certain other variations are also possible, both with the running/fixed window alternatives and the individual/aggregate alternatives. For instance, a running window may contain a set number of compress calls occurring every 2nd, 3rd, 10th, etc. call prior to the current compress call, instead of a preceding group of each N compress calls. For example, the running window may define a group including every 5th call preceding the current call, until a total of twenty calls are found. Likewise, a fixed window may selectively examine compress calls, taking every 2nd, 3rd, 10th, etc. compress call within the prescribed NUMBER TO SAMPLE. Also, instead of ordinal numbers, fixed or running windows may choose some or all sample compress calls using random numbers.

Human-Executed Steps: Response to Poor Compression (FIG. 6)

As described above in conjunction with FIG. 4, appropriate action is taken in step 412 after evaluating one or more compression calls. As one option, task 412 may be performed without human interaction, simply permitting the routine 500 to continue or skip compression as described above.

To boost the efficiency of the compression evaluation and regulation, however, it is advantageous to solicit action from a human operator. Namely, when the routine 500 notifies the calling process of the compression status in step 520, the calling process may assess the situation and decide to deactivate compression, change the adjustable parameters, or rebuild the dictionary. This process is shown in greater detail by the routine 600.

The routine 600 starts in step 604, when the calling process receives notification of compression status, from the compression unit 116 in step 520 (FIG. 5). In response to this information, the process 600 in step 606 decides which of the options 608, 610, or 612 is most appropriate.

One option, step 608, completely disables compression. This option may be appropriate, for example, when the existing dictionary is substantially different than recently encountered data blocks, and the data cannot be taken off-line for rebuilding of the dictionary. In this case, continuing to attempt compression simply wastes valuable processing time, and it may be more advantageous simply to store data uncompressed. This involves a tradeoff between exhaustion of processing time and storage capacity.

Another option, step 610, involves rebuilding the dictionary. This option is also appropriate when the dictionary is substantially different than the recent data blocks, but the host application permits taking the data off-line to rebuild the data dictionary.

The remaining option, step 612, involves changing the adjustable parameters. Namely, the adjustable parameters may be changed to evaluate and regulate more efficiently. For example, the NUMBER TO SAMPLE parameter may be increased to take a bigger sample. This may be a good option if the routine 500 is erroneously finding bad sample ratios because the sample set is too small. Another option is to change the GOOD COMPRESS RATIO and/or the GOOD SAMPLE RATIO parameters, changing the definition of "bad" compression. Still another option is to increase the NUMBER TO SKIP parameter, thereby skipping over more compress calls after a bad sample is found. This technique is especially useful when encountering an isolated, large set of data blocks that is not found in the dictionary.

After the appropriate one of steps 608, 610, or 612 is performed, step 614 restarts the routine 600 under the new mode of operation.

Other Embodiments

While there have been shown what are presently considered to be preferred embodiments of the invention, it will be apparent to those skilled in the art that various changes and modifications can be made herein without departing from the scope of the invention as defined by the appended claims.

What is claimed is:

1. A method of conducting data compression, comprising:
    receiving multiple input data blocks for storage in a data storage subsystem;
    applying a predetermined compression process to each of the received data blocks individually;
    evaluating application of the predetermined compression process according to a predetermined compression; and
    if the compression fails to satisfy the predetermined compression criteria, ceasing compression for subsequent data blocks until satisfaction of a predetermined skip criteria comprising the expiration of a predetermined time, and then resuming application of the predetermined compression process.

2. The method of claim 1, the evaluating of application of the predetermined compression process according to a predetermined compression criteria comprising:

selecting a group of the received data blocks in accordance with a predetermined selection criteria;

for each data block in the selected group, determining a compression ratio between (1) the data block's size after application of the predetermined compression process, and (2) the data block's size prior to application of the predetermined compression process, and for the selected group of received data blocks, determining how many data blocks have a compression ratio greater than a first threshold; and if the number of data blocks having a compression ratio greater than the first threshold exceeds a second threshold, the compression satisfying the predetermined compression criteria.

3. The method of claim 2, the selection of a group of the received data blocks in accordance with a predetermined selection criteria comprising selection of data blocks in a fixed window.

4. The method of claim 2, the selection of a group of the received data blocks in accordance with a predetermined selection criteria comprising selection of data blocks in a running window.

5. The method of claim 1, the evaluating of application of the predetermined compression process according to a predetermined compression criteria comprising:

selecting a group of received data blocks in accordance with a predetermined selection criteria;

for all received data blocks in the selected group, determining an aggregate compression ratio between (1) the aggregate size of the data blocks after application of the predetermined compression process, and (2) the aggregate size of the data blocks prior to application of the predetermined compression process, and determining whether the aggregate compression ratio exceeds a first threshold; and if the aggregate compression ratio exceeds the first threshold, the compression satisfying the predetermined compression criteria.

6. The method of claim 5, the selection of a group of the received data blocks in accordance with a predetermined selection criteria comprising selection of data blocks in a fixed window.

7. The method of claim 5, the selection of a group of the received data blocks in accordance with a predetermined selection criteria comprising selection of data blocks in a running window.

8. The method of claim 1, the cessation of application of the predetermined compression process further comprising:

storing uncompressed data items received during cessation of compression.

9. The method of claim 1, predetermined skip criteria comprising storage of a predetermined number of uncompressed data items.

10. A programmed product comprising signal-bearing media tangibly embodying a program of machine-readable instructions executable by a digital processing apparatus to perform a method for conducting data compression, said method comprising:

receiving multiple data records for storage in a data storage subsystem;

compressing each one of the received data records individually;

evaluating the compression performance according to a predetermined compression criteria; and if the compression fails to satisfy the predetermined compression criteria, terminating compression of subsequent data records until satisfaction of a predetermined skip criteria comprising the expiration of a predetermined time, and then resuming compression for subsequent data records.

11. The product of claim 10, the evaluating of the compression performance according to a predetermined compression criteria comprising:

selecting a group of the received data records in accordance with a predetermined selection criteria;

for each data record in the selected group, determining a compression ratio between (1) the data record's size after compressing, and (2) the data record's size prior to compressing, and for the selected group of received data records, determining how many data records have a compression ratio greater than a first threshold; and if the number of data records having a compression ratio greater than the first threshold exceeds a second threshold, the compression performance satisfying the predetermined compression criteria.

12. The product of claim 11, the selection of a group of the received data records in accordance with a predetermined selection criteria comprising selection of data records in a fixed window.

13. The product of claim 11, the selection of a group of the received data records in accordance with a predetermined selection criteria comprises selection of data records in a running window.

14. The product of claim 10, the evaluating of compression performance according to a predetermined compression criteria comprising:

selecting a group of received data records in accordance with a predetermined selection criteria;

for all received data records in the selected group, determining an aggregate compression ratio between (1) the aggregate size of the data records after compressing, and (2) the aggregate size of the data records prior to compressing, and determining whether the aggregate compression ratio exceeds a first threshold; and if the aggregate compression ratio exceeds the first threshold, the compression performance satisfying the predetermined compression criteria.

15. The product of claim 14, the selection of a group of the received data records in accordance with a predetermined selection criteria comprising selection of data records in a fixed window.

16. The product of claim 14, the selection of a group of the received data records in accordance with a predetermined selection criteria comprising selection of data records in a running window.

17. The product of claim 10, the termination of compression for subsequent data records further comprising:

storing uncompressed data records received during termination of compression.

18. The product of claim 10, the resumption of compression after satisfaction of a predetermined skip criteria comprising:

resuming compression of subsequent data records after storage of a predetermined number of uncompressed data records.

19. A data storage subsystem, comprising:

a storage unit to store digital data blocks;

a storage controller, coupled to the storage unit, and programmed to conduct a data compression process, the process comprising:

receiving multiple input data blocks for storage in a data storage subsystem;

applying a predetermined compression process to each of the received data blocks individually;

evaluating application of the predetermined compression process according to user adjustable and programmable compression criteria; and if the compression fails to satisfy the predetermined compression criteria, ceasing compression of future data blocks until satisfaction of a predetermined skip criteria comprising the expiration of a predetermined time, then resuming application of the predetermined compression process.

20. The subsystem of claim 19, the evaluating of application of the predetermined compression process according to a predetermined compression criteria comprising:

selecting a group of the received data blocks in accordance with a predetermined selection criteria;

for each data blocks in the select group, determining a compression ratio between (1) the data block's size after application of the predetermined compression process, and (2) the data block's size prior to application of the predetermined compression process, and for the selected group of received data blocks, determining how many data blocks have a compression ratio greater than a first threshold; and if the number of data blocks having a compression ratio greater than the first threshold exceeds a second threshold, the compression satisfying the user adjustable and programmable compression criteria.

21. The subsystem of claim 20, the selection of a group of the received data blocks in accordance with a predetermined selection criteria comprising selection of data blocks in a fixed window.

22. The subsystem of claim 20, the selection of a group of the received data blocks in accordance with a predetermined selection criteria comprising selection of data blocks in a running window.

23. The subsystem of claim 19, the evaluating of application of the predetermined compression process according to a predetermined compression criteria comprising:

selecting a group of received data blocks in accordance with a predetermined selection criteria;

for all received data blocks in the selected group, determining an aggregate compression ratio between (1) the aggregate size of the data blocks after application of the predetermined compression process, and (2) the aggregate size of the data blocks prior to application of the predetermined compression process, and determining whether the aggregate compression ratio exceeds a first threshold; and if the aggregate compression ratio exceeds the first threshold, the compression satisfying the user adjustable and programmable compression criteria.

24. The subsystem of claim 23, the selection of a group of the received data blocks in accordance with a predetermined selection criteria comprising selection of data blocks in a fixed window.

25. The subsystem of claim 23, the selection of a group of the received data blocks in accordance with a predetermined selection criteria comprising selection of data blocks in a running window.

26. The subsystem of claim 19, the termination of application of the predetermined compression process further comprising:

storing uncompressed data items received during cessation of compression.

27. The subsystem of claim 19, the resumption of application of the predetermined compression process after satisfaction of a predetermined skip criteria comprising:

resuming application of the predetermined compression process after storage of a predetermined number of uncompressed data items.

* * * * *